Figure 1:
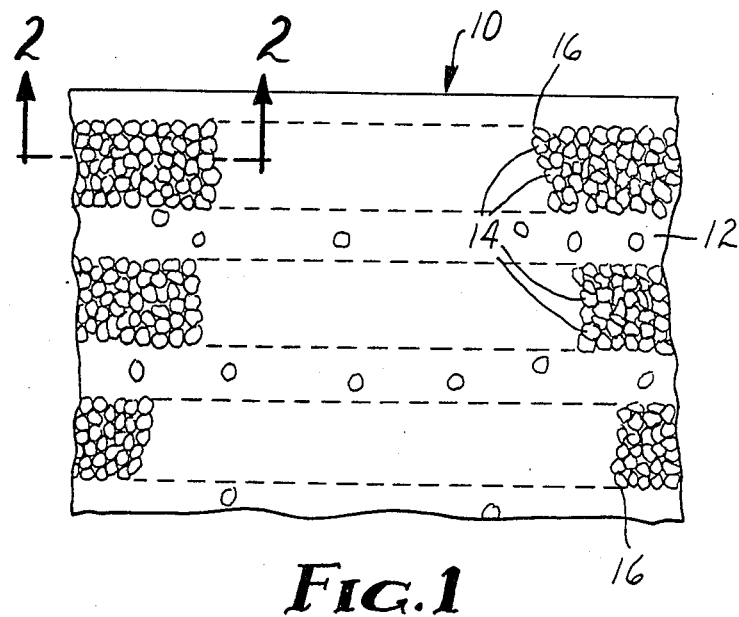

United States Patent [19]

King

[11] Patent Number: 4,546,037

[45] Date of Patent: Oct. 8, 1985

[54] FLEXIBLE TAPE HAVING STRIPES OF ELECTRICALLY CONDUCTIVE PARTICLES FOR MAKING MULTIPLE CONNECTIONS

[75] Inventor: Timothy W. King, Shoreview, Minn.

[73] Assignee: Minnesota Mining and Manufacturing Company, St. Paul, Minn.

[21] Appl. No.: 646,824

[22] Filed: Sep. 4, 1984

[51] Int. Cl.⁴ .................... B32B 3/00; B32B 15/00
[52] U.S. Cl. ................... 428/323; 174/117 A; 427/47; 427/128; 427/208.4; 428/328; 428/329; 428/356; 428/900; 428/906
[58] Field of Search ............... 174/70 C, 88 R, 94 R, 174/117 R, 117 A; 428/195, 198, 206, 323, 328, 329, 344, 356, 900, 906, 922, 204, 208, 208.4; 427/47, 128

[56] References Cited

U.S. PATENT DOCUMENTS

| | | | |
|---|---|---|---|
| 3,132,204 | 5/1964 | Giellerup | 174/117 A |
| 3,359,145 | 12/1967 | Salyer et al. | 156/1 |
| 3,475,213 | 10/1969 | Stow | 428/328 |
| 3,762,946 | 10/1973 | Stow et al. | 428/356 |
| 4,113,981 | 9/1978 | Fujita et al. | 174/88 R |
| 4,258,100 | 3/1981 | Fujitani et al. | 428/356 |
| 4,427,481 | 1/1984 | Smith et al. | 428/356 |
| 4,448,837 | 5/1984 | Ikeda et al. | 428/329 |

Primary Examiner—William J. Van Balen
Attorney, Agent, or Firm—Donald M. Sell; James A. Smith; Richard E. Brink

[57] ABSTRACT

Individual electrical connections between two banks of electrodes can be made by the novel tape, a layer of which contains electrically conductive particles. Each particle has an electrically conductive surface and a ferromagnetic core by which the particles can be magnetically attracted to form nonintersecting stripes, each stripe containing a continuous array of contacting particles and hence being electrically conductive over both its length and thickness.

13 Claims, 2 Drawing Figures

FLEXIBLE TAPE HAVING STRIPES OF ELECTRICALLY CONDUCTIVE PARTICLES FOR MAKING MULTIPLE CONNECTIONS

TECHNICAL FIELD

The invention concerns a flexible tape, a layer of which contains electrically conductive particles that form electrically conductive stripes for making electrical connections, such as between two banks of electrical terminals which cannot be superimposed.

BACKGROUND ART

Modern electronic devices are becoming so small and their electrical terminals are so delicate and closely spaced that it is difficult and expensive to make electrical connections by soldering or other established techniques. U.S. Pat. No. 4,113,981 (Fujita et al.) uses an adhesive layer to make individual electrical connections between two banks of electrodes. The adhesive layer includes spherical electrically conductive particles of substantially the same thickness as the adhesive, thus providing a conductive path through each particle that bridges facing pairs of electrodes. The particles are randomly distributed throughout the adhesive layer, but the Fujita patent indicates that if the particles comprise less than 30% by volume of the layer, they will be sufficiently spaced so that the intervening adhesive will insulate against short circuiting between laterally adjacent electrodes. Carbon powder, SiC powder and metal powder are said to be useful.

Figure 2:
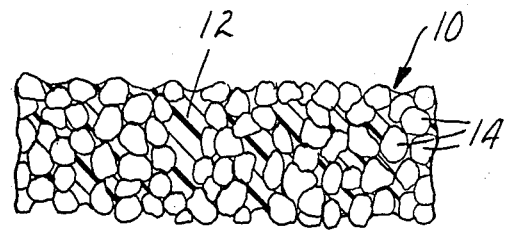

When the electrode banks cannot be superimposed, Fujita would use a tape as shown in FIGS. 1 and 2 including "terminals 5a of a film conductor 5" (col. 2, lines 56–57), which terminals 5a appear to be continuous metallic strips.

U.S. Pat. No. 3,359,145 (Salyer et al.) makes electrically conductive adhesive connections by filling a "hardenable organic adhesive" (col. 2, line 48) with particles having ferromagnetic cores and electrically conductive surfaces. Two electrodes are joined by the adhesive while it is in a mobile state and, while the adhesive is hardening, a magnetic field is applied in the normal direction, thus aligning the particles to form conductive bridges between the electrodes. Preferred particles have an iron core coated with an electrically conductive metal such as silver which is more resistant to oxidation. Preferably the particles are elongated, and their lengths equal or slightly exceed the bond thickness. Any manufacturer of electrical equipment who wished to use Salyer's method to make electrical equipment would need to procure apparatus for creating a suitable magnetic field and to develop the capability of using that apparatus to position that field correctly. Also, special precautions would be necessary if the electrodes to be connected were part of a device which could be damaged by a strong magnetic field.

Salyer does not teach how to electrically interconnect electrodes which cannot be superimposed.

U.S. Pat. No. 3,132,204 (Giellerup) shows a pressure-sensitive adhesive tape wherein "one or more stripes 13 of electrically conductive material are laid over the upper face of the pressure-sensitive adhesive layer, as shown in FIG. 1 of the drawings, and the tape is then passed between a pair of pressure rollers which compact and flatten the stripes of metal foil (particles?) and the adhesive" (col. 2, lines 2–8). "The compacting of the adhesive and the stripes of metal powder increases the conductivity of the electrically conductive metal powders, without coating the metal particles with the adhesive material" (col. 2, lines 35–38). Although we find no teaching in Giellerup of how to use his tape to make electrical connections, it can be assumed that he intended to use it to make individual electrical connections between two banks of electrodes which cannot be superimposed, with the pressure-sensitive adhesive serving to hold each end of the tape to the substrate of one bank.

DISCLOSURE OF THE INVENTION

The invention concerns a flexible tape that, like the adhesive layer of the Giellerup patent, can make individual electrical connections between two banks of electrodes which cannot be superimposed. However, the electrical conductivity of the novel tape is achieved by electrically conductive particles which are unlike those of the Giellerup patent and instead are similar to those of the Salyer patent.

Briefly, the novel flexible tape comprises a layer containing electrically conductive particles embedded in a polymeric dielectric matrix within an orderly pattern of nonintersecting stripes. Each of the particles of the novel tape has a ferromagnetic core and an electrically conductive surface. The maximum dimension of substantially every particle is less than the thickness of the layer. The particles contact each other in a continuous array so that each stripe is electrically conductive over both its length and thickness. Since it should always be feasible to position two electrode arrays close to each other, good lengthwise electrical conductivity may be required only over a short distance such as 0.5 cm and rarely over more than 2.0 cm.

In contrast to problems mentioned above in using the method of the Salyer patent, the novel tape can be used to make electrical connections without need for special equipment or specially trained personnel.

A preferred method of making the novel tape comprises the sequential steps of:

(1) coating onto a flexible carrier web a mixture of low-viscosity photopolymerizable monomer and particles, each having a ferromagnetic core and an electrically conductive surface, the maximum dimension of substantially every particle being less than the ultimate thickness of the coating, (2) then simultaneously
  (a) subjecting the coating to a plurality of spaced-apart magnetic fields, each of a strength sufficient to attract the particles to form nonintersecting stripes, in each of which particles contact each other in a continuous array so that each stripe is electrically conductive over both its length and thickness, and
  (b) photopolymerizing the monomer to fix each array of particles within a polymeric dielectric matrix, and (3) removing the tape from the magnetic fields.

The magnetic fields applied in step (2) preferably are parallel but can extend in various orderly patterns. By virtue of their ferromagnetic cores, the particles are magnetically attracted to form nonintersecting stripes, each stripe containing a continuous array of contacting particles and hence being electrically conductive over both its length and thickness. Hence, a pair of electrodes can be electrically connected through each stripe. By employing a pressure-sensitive adhesive as the dielectric matrix, the connections can be secured merely by pressing each end of the tape against one of the electrode banks and its substrate.

Preferably the carrier web is moved continuously through steps (1) and (2), and after step (3) is step (4) winding the tape upon itself in roll form. Manufacturers of electronic devices should find it far more convenient to unroll and dispense pieces of the tape to make electrical connections, as compared to the method taught in the Salyer patent.

By "low-viscosity photopolymerizable monomer" is meant a monomor having a viscosity of less than 40,000 cps and preferably at least 1000 cps. Useful monomers often initially have viscosities below 1000 cps, in which case they may be partially polymerized to a viscosity within the range of about 1000 to 40,000 cps before being mixed with the electrically-conductive particles and coated onto the flexible carrier web. Partial polymerization may either be carried out thermally or by ultraviolet radiation using a photoinitiator which is not a crosslinker such as 2,2-dimethoxy-2-phenyl acetophenone ("Irgacure" 651 from Ciba-Geigy Corp.). Before being photopolymerized, the particle-containing coating preferably includes an agent by which it is crosslinked during photopolymerization, thus developing good resistance to heat and better assuring that each array of contacting particles remains intact during use. Some useful crosslinking agents also function as photopolymerization initiators such as 2,4-bis(trichloromethyl)-6-p-methoxystyryl-s-triazine. The chromophore-substituted halomethyl-s-triazines of U.S. Pat. Nos. 4,329,384 and 4,330,590 are especially useful where a high resistance to peelback is desired. Other useful photocrosslinkers are polyacrylic-functional monomers such as trimethylolpropane triacrylate; pentaerythritol tetraacrylate; 1,2-ethylene glycol diacrylate; 1,6-hexanediol diacrylate; and 1,12-dodecanediol diacrylate. Each of these photocrosslinkers is preferably used within the approximate range of 0.05 to 0.5 percent by weight of the polymerizable monomer.

The above-outlined method of making the novel tape by photopolymerization produces no volatile matter, and when the monomer polymerizes to a pressure-sensitive adhesive state, this method also tends to provide higher adhesive values than can be achieved when coating pressure-sensitive adhesive polymers from solutions or emulsions. Also, it is believed to be more economical to maintain a magnetic field while the dielectric matrix is being solidified by photopolymerization rather than while driving off volatile matter. Nevertheless, the adhesive or other dielectric matrix of the novel tape can be coated from solution or emulsion and cured by conventional techniques, e.g., heat, electron beam, gamma radiation, or ionizing radiation.

Some block copolymers which are pressure-sensitive adhesives at ordinary room temperatures are of low viscosity when heated to moderately elevated temperatures such as 95° C. While being heated, these can be admixed with electrically conductive particles and then coated onto carrier webs and cooled in a magnetic field to provide tapes of the invention without evolving any volatile matter.

Economically, the magnetic fields are created by a multi-pole permanent magnet or a group of magnets positioned immediately beneath the carrier web. Useful low-cost permanent magnets comprise barium ferrite platelets dispersed in a rubber matrix, being available in large sheets so that photopolymerization of the dielectric matrix can be carried out continuously while the carrier web travels beneath a bank of ultraviolet lamps and along a magnet sheet having a plurality of north and south poles, each extending the length of the magnet sheet. This forms a continuous array of contacting electrically conductive particles above each pole of the magnet sheet.

Preferred electrically conductive particles have a nickel or iron core and a corrosion-resistant, electrically conductive coating, such as silver, copper or gold, which can be economically applied by electroless plating. An especially economical electrically conductive coating is aluminum. Useful but less preferred for the ferromagnetic core are materials such as barium ferrite which cannot readily be electrolessly plated and are preferably applied by a technique which may be more expensive, e.g., by sputtering or vapor deposition. Preferably, the weight ratio of a corrosion-resistant surface coating to a ferromagnetic core is about 30 to 70. Weight ratios less than about 10 to 90 may not provide adequate corrosion protection and conductivity, while weight ratios greater than about 50 to 50 may be economically wasteful, in silver content for example. For a further discussion of useful coated particles see U.S. Pat. No. 3,359,145. Also useful are nickel particles which have both a ferromagnetic core and an electrically conductive surface, but because nickel can oxidize and lose its surface conductivity, it preferably is coated with a more durable metal.

The cores of the electrically conductive particles may have any shape, e.g., spherical, acicular, or flake, and when coated, retain substantially the same shape. Spherical particles preferably average from about 5 to 15 micrometers in diameter. Flakes or platelets and acicular particles preferably are less than about 20 micrometers in their maximum dimensions.

It may be sufficient to use as little as 2 volume percent of the electrically conductive particles in the dielectric matrix of the novel tape. Between 3 and 5 volume percent is preferred. Higher loadings are desirable when the stripes are closer together. To use more than 10 volume percent of the particles may be economically wasteful, except to attain higher stripe density.

Especially useful as the photopolymerizable monomer are compositions which photopolymerize to a pressure-sensitive adhesive state and comprise 50–100 parts of substituted or unsubstituted alkyl acrylate or methacrylate monomers (all of which are hereinafter sometimes collectively referred to as "acrylate monomer") and 0–50 parts of copolymerizable monoethylenically-substituted monomer. Preferred among these are copolymers of (1) 88–99 mol percent of alkyl acrylate having an average of 4–12 carbon atoms in their alkyl groups and (2) correspondingly, 12–1 mol percent of copolymerizable polar monomer such as acrylic acid, methacrylic acid, itaconic acid, acrylamide, and methacrylamide. The latter two are preferred because acids react with some electrically conductive particles. Other useful polar monoethylenically-unsaturated monomers which are copolymerizable with acrylate monomer include N-substituted acrylamides, acrylonitrile, methacrylonitrile, hydroxyalkyl acrylates, cyanoethyl acrylate, maleic anhydride, and N-vinyl-2-pyrrolidone, all of which result in pressure-sensitive adhesives which are tacky at ordinary room temperature when used with $C_{4-12}$ alkyl acrylate in amounts up to about 12 mol percent of the acrylate monomer, or up to about 50 mol percent when the copolymerizable monomer is mainly N-vinylpyrrolidone. Other copolymerizable monomers that should be useful include alkyl vinyl ethers, vinylidene chloride, styrene, and vinyltoluene.

Pressure-sensitive adhesives useful for the novel tape need not be tacky at room temperature if they become tacky upon being heated to moderately elevated temperatures. Such a pressure-sensitive adhesive may be obtained by using acrylate monomers having an average of only 1-3 carbon atoms or by copolymerizing acrylate monomers having longer alkyl groups with relatively large proportions of one or more of the aforementioned copolymerizable monomers. As compared to pressure-sensitive adhesive layers which are tacky at ordinary room temperatures, those which become tacky only when heated and are applied while tacky afford increased resistance to failures, both in shear and in peel, at both ordinary room temperatures and when exposed to elevated temperatures.

THE DRAWING

In the drawing:

FIG. 1 is a sketch schematically showing a fragment of a face of a tape embodying the invention; and FIG. 2 is an enlarged cross-section taken along line 2—2 of FIG. 1.

The tape 10 shown in FIGS. 1 and 2 comprises a layer of pressure-sensitive adhesive 12 containing arrays of substantially spherical, electrically conductive particles 14 which together form an orderly pattern of nonintersecting stripes 16. Each of the particles 14 has a ferromagnetic core and an electrically conductive surface layer. In each stripe, the particles 14 contact each other in continuous array so that each stripe is electrically conductive over both its length and width.

Although the tape 10 has parallel, longitudinal, particle-containing stripes, the stripes could extend obliquely or transversely.

In the following examples, all parts are by weight unless otherwise indicated.

EXAMPLE 1

Silver was plated electrolessly onto spherical iron particles to a weight ratio of 25:75 silver:iron as follows. To a solution of 12.5 g of silver nitrate in 250 ml of distilled water was added dropwise approximately 16 ml of 28% ammonium hydroxide with stirring until the initially formed dark precipitate had just dissolved. This solution was then added to 25 g of reduced iron powder with stirring. To the resultant suspension was added a solution consisting of 8 g of anhydrous dextrose and 12.5 g of potassium hydroxide in 150 ml of distilled water. Stirring was continued for 3 minutes. The resulting light grey powder was filtered, washed well with distilled water, and dried overnight at 60° C. Mean diameter of the silver-coated particles was about 15 micrometers.

A mixture of 98 parts of isooctyl acrylate, 2 parts of acrylic acid and 0.04 part of photoinitiator [2,2-dimethoxy-2-phenylacetophenone (available as "Irgacure" 651)] was partially photopolymerized to a syrup having a viscosity of about 1000 centipoises. To 3 parts of this syrup was added one part of the above silver-coated iron particles (3.2% by volume). To this was added 0.05 part of hexanediol diacrylate crosslinker and an additional 0.1 part of the "Irgacure" 651 photoinitiator followed immediately by coating between two silicone-treated transparent plastic films to a thickness of 75 micrometers and passing this at a speed of about one cm/sec. over a flat permanent magnet which extended in the direction of movement. The permanent magnet had been magnetized to have 3 N and S poles per cm across its upper face and extending in the direction of movement. The silver-coated particles migrated to form distinct stripes, each corresponding to an intersection between adjacent poles of the magnet. Adjacent stripes were separated by about 0.7 mm of substantially particle-free syrup. Exposure for 3 minutes to six 20-watt black fluorescent lights from a distance of 15 cm photopolymerized the coating to a pressure-sensitive adhesive state.

Microscopic examination of the resulting tape obliquely through one of the silicone-treated plastic films at 10X magnification revealed that each stripe consisted of spherical particles that contacted each other to form a continuous array.

EXAMPLE 2

3.75 g of silver-plated, spherical iron particles was dispersed in a solution of 10 g of polyester resin ("Vitel" 222) in 20 g of methyl ethyl ketone. The dispersion was coated onto a silicone-treated release paper which was laid on the flat permanent magnet used in Example 1. Within five seconds the particles had migrated to form stripes separated by clear, unfilled regions. This was dried at 150° C. for 3 minutes to a dried thickness of 25 micrometers to provide a tape which can be used to make multiple electrical connections. At the exposed face of the tape, the stripes protruded to a noticeable extent above the unfilled regions.

Using probes spaced 2.54 cm apart, each stripe of the tape had a resistance of about 8.5 ohms, whereas the resistance between adjacent stripes exceeded $10^8$ ohms. Resistance of each stripe through the thickness of the tape was from 1 to 3 ohms.

I claim:

1. Flexible tape for making multiple electrical connections comprising a layer containing electrically conductive particles embedded in a polymeric dielectric matrix within an orderly pattern of nonintersecting stripes, each of the particles having a ferromagnetic core and an electrically conductive surface, the maximum thickness of substantially every particle being less than the thickness of the layer, the particles in each stripe contacting each other in continuous array so that each stripe is electrically conductive over both its length and thickness.

2. Flexible tape as defined in claim 1 wherein each particle has an electrically conductive coating over its ferromagnetic core.

3. Flexible tape as defined in claim 2 wherein the ferromagnetic core is iron.

4. Flexible tape as defined in claim 3 wherein the coating comprises silver.

5. Flexible tape as defined in claim 1 wherein the polymeric dielectric matrix is a pressure-sensitive adhesive.

6. Flexible tape as defined in claim 5 wherein said layer is supported by a disposable carrier web which has a low-adhesion surface in contact with the pressure-sensitive adhesive matrix.

7. Flexible tape as defined in claim 1 wherein said particles comprise from 2 to 5 volume percent of the layer.

8. Method of making flexible multiple-connector tape comprising the steps of:

(1) coating onto a flexible carrier web a mixture of photopolymerizable monomer and particles, each particle having a ferromagnetic core and an electrically conductive surface, the maximum dimension of substantially every particle being less than the ultimate thickness of the coating, (2) then simultaneously
  (a) subjecting the coating to a plurality of spaced-apart magnetic fields, each of a strength sufficient to attract the particles to form stripes, in each of which particles contact each other in a continuous array so that each stripe is electrically conductive over both its length and thickness, and
  (b) photopolymerizing the monomer to fix each chain of particles in a polymeric dielectric matrix, and (3) removing the tape from the magnetic fields.

9. Method as defined in claim 8 wherein the monomer is photopolymerized in Step 2(b) to a pressure-sensitive adhesive state.

10. Method as defined in claim 8 wherein the photopolymerizable monomer has been partially polymerized to a coatable viscosity prior to Step (1).

11. Method as defined in claim 8 wherein said particles comprise from 2 to 5 volume percent of said photopolymerizable mixture.

12. Method as defined in claim 8 wherein the carrier web is moved continuously through Steps (1) and (2), and the tape is wound upon itself in roll form.

13. Method as defined in claim 8 wherein the carrier web is a disposable film having a low-adhesion surface to which the coating is applied.

* * * * *